United States Patent
Wu et al.

(10) Patent No.: US 11,837,572 B2
(45) Date of Patent: Dec. 5, 2023

(54) APPARATUS AND METHOD FOR MANUFACTURING SEMICONDUCTOR PACKAGE STRUCTURE

(71) Applicant: Advanced Semiconductor Engineering, Inc., Kaohsiung (TW)

(72) Inventors: Chun-Min Wu, Kaohsiung (TW); Cheng-Lin Li, Kaohsiung (TW)

(73) Assignee: ADVANCED SEMICONDUCTOR ENGINEERING, INC., Kaohsiung (TW)

( * ) Notice: Subject to any disclaimer, the term of this patent is extended or adjusted under 35 U.S.C. 154(b) by 58 days.

(21) Appl. No.: 17/337,216

(22) Filed: Jun. 2, 2021

(65) Prior Publication Data

US 2022/0392868 A1 Dec. 8, 2022

(51) Int. Cl.
*H01L 23/00* (2006.01)

(52) U.S. Cl.
CPC ............ *H01L 24/742* (2013.01); *H01L 24/11* (2013.01); *H01L 2224/119* (2013.01); *H01L 2224/11822* (2013.01); *H01L 2924/3701* (2013.01)

(58) Field of Classification Search
CPC ... H01L 24/742; H01L 24/11; H01L 2224/119
See application file for complete search history.

(56) References Cited

U.S. PATENT DOCUMENTS

| | | | | |
|---|---|---|---|---|
| 6,803,984 B2* | 10/2004 | Park | ...................... | G02F 1/1341 349/190 |
| 7,629,674 B1* | 12/2009 | Foster | ..................... | H01L 21/56 257/659 |
| 9,748,157 B1* | 8/2017 | Chi | ........................ | H01L 23/28 |
| 2004/0026484 A1* | 2/2004 | Yamashita | ........... | B23K 35/262 257/E21.511 |
| 2018/0122762 A1* | 5/2018 | Yeruva | .................... | H01L 23/24 |

\* cited by examiner

*Primary Examiner* — Mohammad M Choudhry
(74) *Attorney, Agent, or Firm* — FOLEY & LARDNER LLP (57) ABSTRACT

An apparatus and method for manufacturing a semiconductor package structure are provided. The method includes: providing a process line comprising a first semiconductor manufacturing portion configured to provide a first operation including a first process step, and a second semiconductor manufacturing portion configured to provide a second operation including a second process step; passing a packaging structure through the second semiconductor manufacturing portion, wherein the second semiconductor manufacturing portion applies the second process step to the packaging structure; passing the packaging structure through the first semiconductor manufacturing portion, wherein the first semiconductor manufacturing portion applies the first process step to the packaging structure; and passing the packaging structure through the second semiconductor manufacturing portion again without applying the second process step thereon.

12 Claims, 5 Drawing Sheets

APPARATUS AND METHOD FOR MANUFACTURING SEMICONDUCTOR PACKAGE STRUCTURE

BACKGROUND

1. Field of the Disclosure

The present disclosure relates to methods for manufacturing a semiconductor package structure, and particularly to a method using an apparatus with a process line.

2. Description of the Related Art

Mass production of semiconductor package structures requires cycle time and tool efficiency to be highly refined. A module, in series with other modules to form a process line, capable of applying two or more operations to a package structure can apply different operations to different stages of products. However, this may leave the module idle, reducing tooling efficiency. Therefore, apparatus and methods are required equal to solving the aforementioned problems.

SUMMARY

In some embodiments, a method of manufacturing a semiconductor package structure includes: providing a process line comprising a first semiconductor manufacturing portion configured to provide a first operation including a first process step, and a second semiconductor manufacturing portion configured to provide a second operation including a second process step; passing a packaging structure through the second semiconductor manufacturing portion, wherein the second semiconductor manufacturing portion applies the second process step to the packaging structure; passing the packaging structure through the first semiconductor manufacturing portion, wherein the first semiconductor manufacturing portion applies the first process step to the packaging structure; and passing the packaging structure through the second semiconductor manufacturing portion again without applying the second process step thereon.

In some embodiments, an apparatus for manufacturing a semiconductor package structure includes a first semiconductor manufacturing portion configured to provide a first operation including a first process step. The apparatus also includes a second semiconductor manufacturing portion configured to provide a second operation including a second process step. The apparatus further includes a material handling tool configured to make a packaging structure passed through the second semiconductor manufacturing portion and bypassed from being applying the second process step on the packaging structure.

In some embodiments, a method of manufacturing a semiconductor package structure includes: providing a process line comprising a flux dipping portion; performing a first ball mounting process on a first packaging structure; and passing the first packaging structure and a second packaging structure through the flux dipping portion; wherein a flux dipping process is performed on the second packaging structure with the first packaging structure being passed through the flux dipping portion without a flux dipping process is performed thereon.

BRIEF DESCRIPTION OF THE DRAWINGS

Aspects of some embodiments of the present disclosure are readily understood from the following detailed description when read with the accompanying figures. It is noted that various structures may not be drawn to scale, and dimensions of the various structures may be arbitrarily increased or reduced for clarity of discussion.

DETAILED DESCRIPTION

Common reference numerals are used throughout the drawings and the detailed description to indicate the same or similar components. Embodiments of the present disclosure will be readily understood from the following detailed description taken in conjunction with the accompanying drawings.

The following disclosure provides for many different embodiments, or examples, for implementing different features of the provided subject matter. Specific examples of components and arrangements are described below to explain certain aspects of the present disclosure. These are, of course, merely examples and are not intended to be limiting. For example, the formation of a first feature over or on a second feature in the description that follows may include embodiments in which the first and second features are formed or disposed in direct contact, and may also include embodiments in which additional features may be formed or disposed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

The embodiments of the disclosure provide methods to form electronic conductor(s) (e.g., solder balls) on electrical terminals (e.g., pads). Pollutants, such as metal oxide or other residues, on the pads may cause failure in forming the solder balls on the pads. Therefore, one or more techniques are applied to the pads to remove pollutants from the pads before attaching the solder balls to the pads. Further, the method and the apparatus of the disclosure may allow semiconductor manufacturing tools to perform an operation on different packaging structures, thereby improving efficiency of the semiconductor manufacturing tool and preventing tools from being idle.

Figure 1:
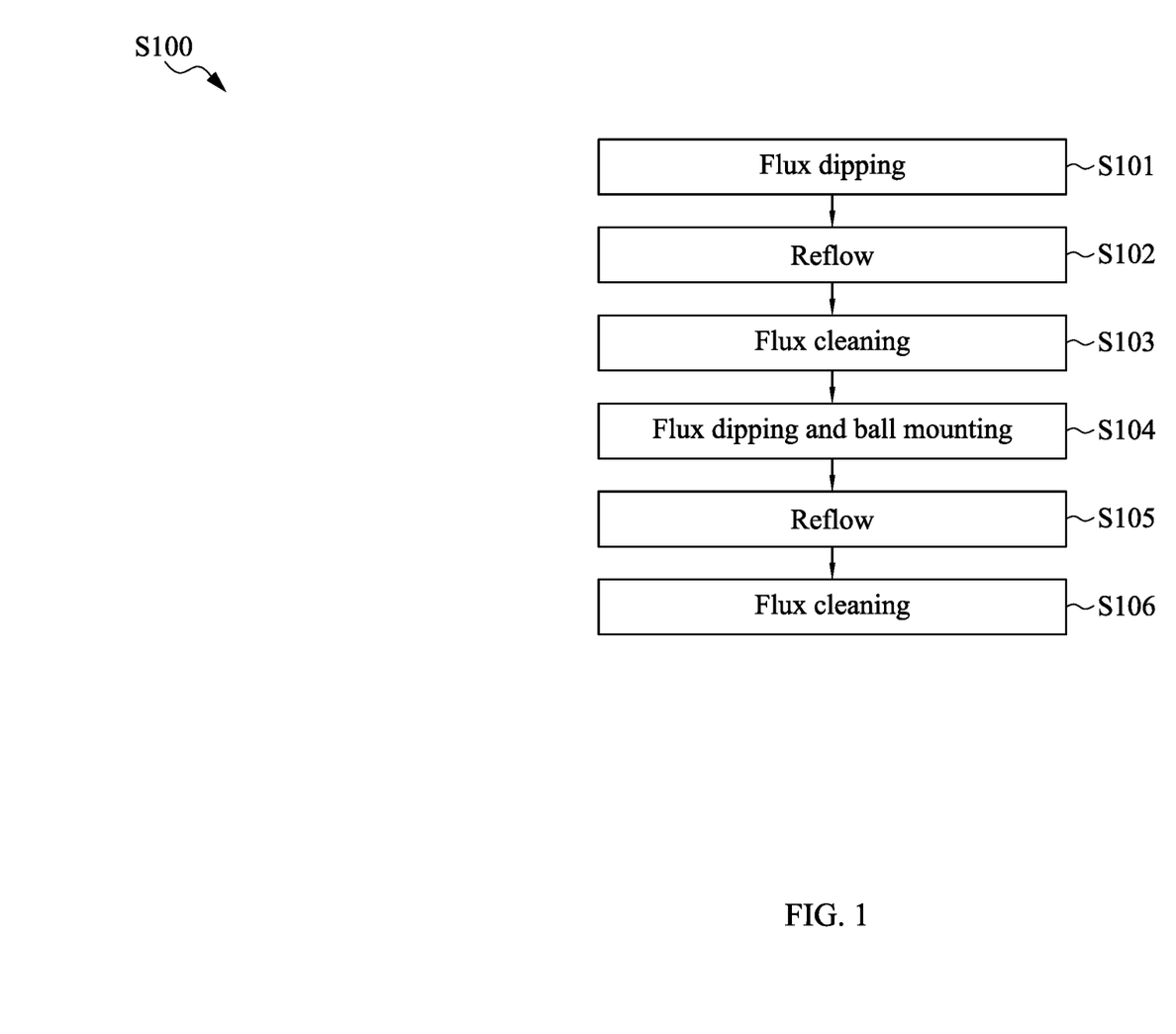
FIG. 1 illustrates a flow chart of manufacturing a semiconductor package structure according to some embodiments of the present disclosure.

FIG. 1 illustrates a flow chart of a method 100 to manufacture a semiconductor package structure according to some embodiments of the present disclosure.

The method S100 applies multiple operations on a package structure (or a processing object). The package structure may include a substrate, such as a wafer, a semiconductor substrate, a lead frame, a printed circuit board, a carrier, or other suitable substrates. The package structure may include electronic component(s). The electronic component(s) may include active components and/or passive components. The active component may include a semiconductor die or a chip, such as a logic die (e.g., system-on-a-chip (SoC), central processing unit (CPU), graphics processing unit (GPU), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), or other active components. The passive component may include a capacitor, a resistor, an inductor, or other passive components. The package structure may include electric conductor(s). The electric conductor may be configured to electrically connect two electronic components. The electric conductor may include a redistribution structure, a trace, a wire-bond, a through-silicon-via, a solder ball, or other electric conductors. The package structure may further include molding compound(s) or other dielectric structures.

In some embodiments, the method S100 may be used to form electrical conductor(s), such as solder balls, on electrical terminal(s) (e.g., pads) of a package structure. In some embodiments, the method S100 may include operations S101, S102, S103, S104, S105 and S106. Each of the operations may be applied by one semiconductor manufacturing portion, respectively. Each of the operations may include one or more processes. Further, every semiconductor manufacturing portion may apply one or more processes. It is contemplated that the method S100 may be used in other stages of manufacturing a semiconductor package structure.

In some embodiments, the operations S101, S102 and S103 are configured to remove pollutants, such as metal oxide or other residues, from electrical terminals before forming electrical conductors (e.g., solder balls) on the electrical terminals.

The operation S101 may include applying a flux dipping process (or a dipping process), which may be configured to spread pollutant-removing solvent on the surface of the electrical terminals. The pollutant-removing solvent may be used to react with or dissolve the pollutants and form a protective film on the surface of the electrical terminals. The pollutant-removing solvent may include flux, which may include, for example, rosin and other components.

The operation S102 may include applying a reflow process, which may be configured to activate pollutant-removing solvent such that the pollutant-removing solvent may react with or dissolve the pollutants on the electrical terminals.

The operation S103 may include applying a flux cleaning process, which may be configured to remove the activated pollutant-removing solvent after reflow.

After applying the operations S101, S102 and S103, pollutants on the surface of the electrical terminals may be substantially removed. Further, a protective film may be formed on the surface of the electrical terminals to prevent the electrical terminals from oxidation or contamination.

In some embodiments, the method S100 may include operations S104, S105, and S106, which are configured to form electrical conductors, such as solder balls, on the electrical terminals (e.g., pads).

The operation S104 may include applying a flux dipping process and a ball mounting process. The ball mounting process may be configured to form electrical conductors, such as solder balls, on the electrical terminals. The flux dipping process may be configured to let solder-assisting solvent spread on the surface of the electrical conductors (e.g., solder balls). The solder-assisting solvent may include flux, which may include, for example, rosin and other components. In some embodiments, the solder-assisting solvent may be substantially the same as or similar to the pollutant-removing solvent.

The operation S105 may include applying a reflow process, which may be configured to activate solder-assisting solvent such that the solder-assisting solvent may assist in attaching the electrical conductors to the electrical terminals. In some embodiments, the operation S105 may have a process condition substantially the same as or similar to that of the operation S102.

The operation S106 may include flux cleaning, which may be configured to remove exceeding solder-assisting solvent remaining on the surface of the electrical conductors. In some embodiments, the operation S106 may have a process condition substantially the same as or similar to that of the operation S103.

After applying the operations S104, S105, and S106, the electrical conductors may be formed on the electrical terminals, and additional operations may be applied to create a semiconductor package structure.

Figure 2:
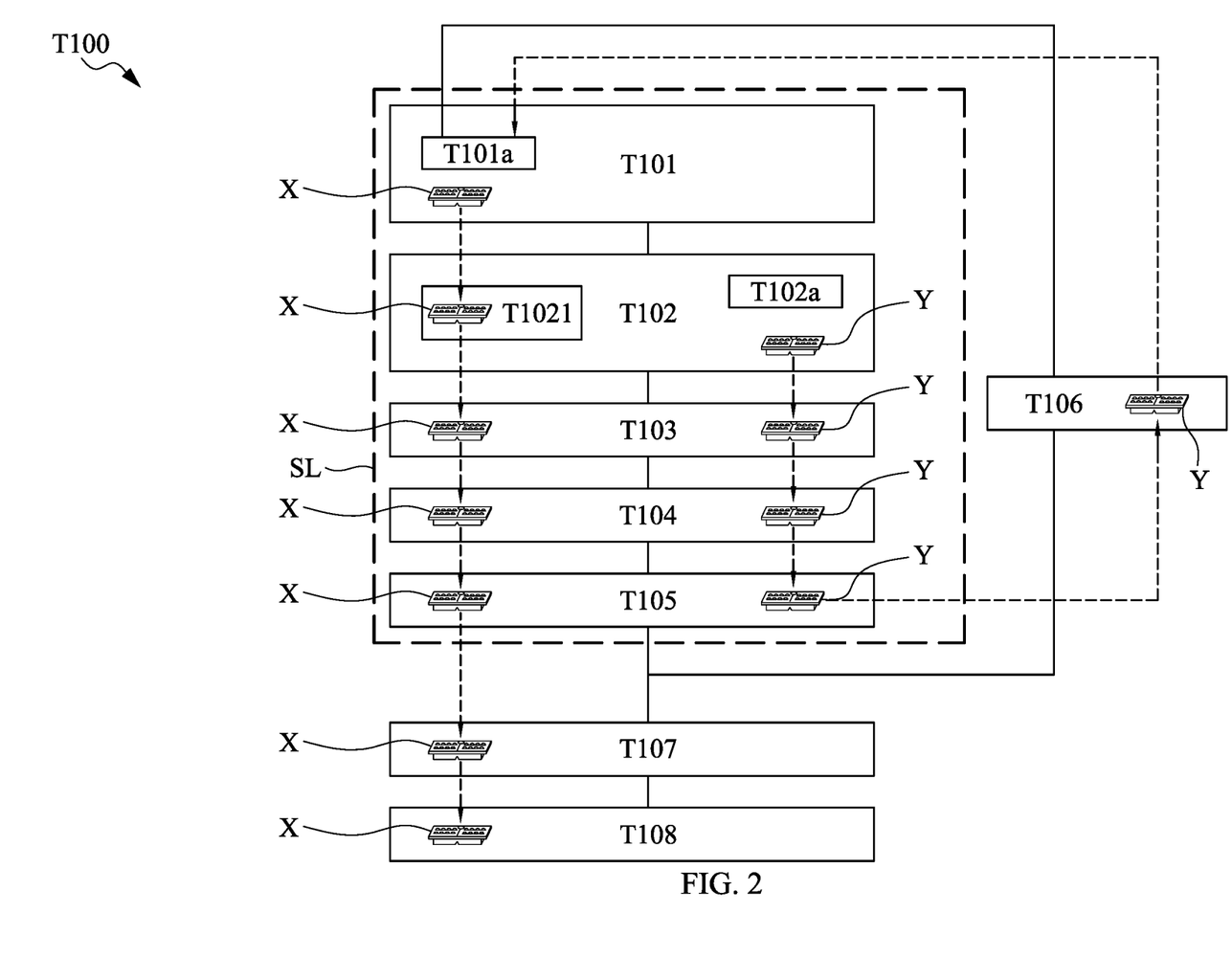
FIG. 2 illustrates an apparatus including a process line of manufacturing a semiconductor package structure according to some embodiments of the present disclosure.

FIG. 2 illustrates an apparatus T100 including a process line SL according to some embodiments of the present disclosure.

In some embodiments, the apparatus T100 may be used to manufacture a semiconductor package structure. For example, the apparatus T100 may be used to, but is not limited to, remove pollutants from electrical terminals (e.g., pads) and/or form electrical conductors (e.g., solder balls) on the electrical terminals. In some embodiments, the apparatus T100 may include semiconductor manufacturing portions T101, T102, T103, T104, and T105 as well as transport tools T106 and T107. The semiconductor manufacturing portions T101, T102, T103, T104 and T105 may be connected in series to form a process line SL. The process line SL may include semiconductor manufacturing portions connected in series. When a package structure (or a processing object) is loaded into the process line SL, the package structure may pass through these semiconductor manufacturing portions in sequence. The process line SL may further include other semiconductor manufacturing portions inserted between any two semiconductor manufacturing portions if needed.

The semiconductor manufacturing portion T101 may include a flux dipping and ball mounting tool (or may be referred to as a ball mounting tool since the main operation of the semiconductor manufacturing portion T101 is performing ball mounting). In some embodiments, the flux dipping and ball mounting tool may be configured to apply either a flux dipping process, a ball mounting process, or both to packaging structure X (or first processing objects X). In some embodiments, the packaging structure X may have cleaned electrical terminals (e.g., pads) such that electric conductors (e.g., solder balls) can be formed on the electrical terminals. The semiconductor manufacturing portion T101 may include a load-port unit T101a connected to the transport tool T106 to receive packaging structure X or packaging structure Y from the transport tool T106. The load-port unit T101a of the semiconductor manufacturing portion T101 may provide an entrance to allow the packaging structure X or packaging structure Y to enter into the process line SL. In some embodiments, the semiconductor manufacturing portion T101 may apply an operation corresponding to operation S104 shown in FIG. 1.

The semiconductor manufacturing portion T102 is in series with the semiconductor manufacturing portion T101.

In some embodiments, the semiconductor manufacturing portion T102 may include a flux dipping tool. The flux dipping tool may be configured to apply a flux dipping process on the packaging structure Y (or second processing objects Y). In some embodiments, the packaging structure Y may have uncleaned electrical terminals (e.g., pads) on which pollutants, such as metal oxide or other residues, remain. In some embodiments, the semiconductor manufacturing portion T102 may include one or more load-port units. For example, the semiconductor manufacturing portion T102 may include a first load-port unit (not shown) and a second load-port unit, such as the load-port unit T102a. The first load-port unit is configured to receive the packaging structure X from the semiconductor manufacturing portion T101. The second load-port unit, such as the load-port unit T102a, is configured to receive packaging structure Y that do not pass through the semiconductor manufacturing portion T101, and provide an entrance to allow the packaging structure Y to enter into the process line SL. In some embodiments, the semiconductor manufacturing portion T102 may apply an operation corresponding to operation S101 shown in FIG. 1. In some embodiments, both the semiconductor manufacturing portions T101 and T102 may be operated at the same time. In some embodiments, the operation times of the semiconductor manufacturing portions T101 and T102 may partially overlapped.

In some embodiments, the semiconductor manufacturing portion T102 may include a bypass T1021 (or a material handling tool). The bypass T1021 is configured to transport the packaging structure X to the semiconductor manufacturing portion T103 without being processed by the flux dipping process. That is, the bypass T1021 may allow the packaging structure X to bypass the semiconductor manufacturing portion T102. The semiconductor manufacturing portion T102 may include four tracks, two of which are configured to transport the packaging structure Y, remaining two of which are configured to bypass the packaging structure X.

The semiconductor manufacturing portion T103 is in series with the semiconductor manufacturing portion T102. In some embodiments, the semiconductor manufacturing portion T103 may include a reflow tool. The reflow tool may be configured to apply a reflow process to either packaging structure X, packaging structure Y, or both. In some embodiments, the semiconductor manufacturing portion T103 may include a first load-port unit (not shown) and a second load-port unit (not shown). The first load-port unit is configured to receive the packaging structure X from the bypass T1021. The second load-port unit is configured to receive the packaging structure Y. In some embodiments, the semiconductor manufacturing portion T103 may apply an operation corresponding to operations S102 and/or S105 as shown in FIG. 1.

In some embodiments, the semiconductor manufacturing portion T103 may include a chamber configured to accommodate both the packaging structure X and the packaging structure Y such that the semiconductor manufacturing portion T103 may apply the reflow process to both the packaging structure X and the packaging structure Y simultaneously. In some embodiments, the semiconductor manufacturing portion T103 may include four tracks, two of which are configured to transport packaging structure X and connected to tracks, used to bypass the packaging structure X, of the semiconductor manufacturing portion T102, remaining two of which are configured to transport the packaging structure Y and connected to the tracks, used to transport the packaging structure Y, of the semiconductor manufacturing portion T102. The semiconductor manufacturing portion T103 can apply the reflow process to either the packaging structure X, the packaging structure Y or both as shown in FIG. 1.

The semiconductor manufacturing portion T104 is in series with the semiconductor manufacturing portion T103. In some embodiments, the semiconductor manufacturing portion T104 may include a flux clean tool. The flux clean tool may be configured to apply a flux clean process on either packaging structure X, packaging structure Y, or both. In some embodiments, the semiconductor manufacturing portion T104 may apply an operation corresponding to the operation S103 and/or operation S106.

In some embodiments, the semiconductor manufacturing portion T104 may include a chamber configured to accommodate both the packaging structure X and the packaging structure Y such that the semiconductor manufacturing portion T104 can apply the flux clean process to both the packaging structure X and the packaging structure Y simultaneously. In some embodiments, the semiconductor manufacturing portion T104 may include four tracks, two of which are configured to transport the packaging structure X, remaining two of which are configured to transport the packaging structure. The semiconductor manufacturing portion T104 can apply the flux clean process to either the packaging structure X and the packaging structure Y or both.

The semiconductor manufacturing portion T105 (or an unloading portion) is in series with the semiconductor manufacturing portion T104. In some embodiments, the semiconductor manufacturing portion T105 may include an unloading tool. The unloading tool may be configured to unload either packaging structure X, packaging structure Y, or both from the process line SL. The unloading tool may further identify the packaging structure X and the packaging structure Y, and group them in different container(s) or vessel(s).

In some embodiments, the semiconductor manufacturing portion T105 may unload the packaging structure X and packaging structure Y simultaneously. In some embodiments, the semiconductor manufacturing portion T105 may unload only the packaging structure X or only the packaging structure Y. For example, if one of the packaging structure X and the packaging structure Y is not loaded into the semiconductor manufacturing portion T105, the semiconductor manufacturing portion T105 can unload the other. In some embodiments, the semiconductor manufacturing portion T105 includes 16 magazines for loading package structure (or processing objects).

In some embodiments, the apparatus T100 includes a buffer (not shown) between the semiconductor manufacturing portions T104 and T105. The buffer may be configured to hold the packaging structure X, the packaging structure Y or both before they enter the semiconductor manufacturing portion T105 such that the semiconductor manufacturing portions T101-T104 can operate without waiting the semiconductor manufacturing portion T105.

The transport tool T106 (or a transporting portion) may be connected to the semiconductor manufacturing portion T105. The transport tool T106 may be configured to transport the packaging structure Y into the semiconductor manufacturing portion T101. In some embodiments, the transport tool T106 may transport the packaging structure Y by a crane or by manpower.

The transport tool T107 (or a transporting portion) may be connected to the semiconductor manufacturing portion T105. The transport tool T107 may be configured to transport the packaging structure X into a semiconductor manufacturing portion T108. The semiconductor manufacturing portion T108 may be configured to apply another semiconductor manufacturing process on the packaging structure X depending on the requirement. As shown in FIG. 2, the packaging structure Y enters the process line SL from the semiconductor manufacturing portion T102, the packaging structure Y may pass through the semiconductor manufacturing portions T102, T103, 104 and T105 subsequently. Next, the packaging structure Y may enter the process line SL again from the semiconductor manufacturing portion T101, and then bypass the semiconductor manufacturing portion T102 through the bypass T1021. Meanwhile, another packaging structure Y may enter the process line SL from the semiconductor manufacturing portion T102. As a result, the packaging structure Y and additional packaging structure Y may enter the semiconductor manufacturing portion T103 such that the semiconductor manufacturing portion T103 may perform a reflow process on the packaging structure Y and additional packaging structure Y at the same time.

Figure 3:
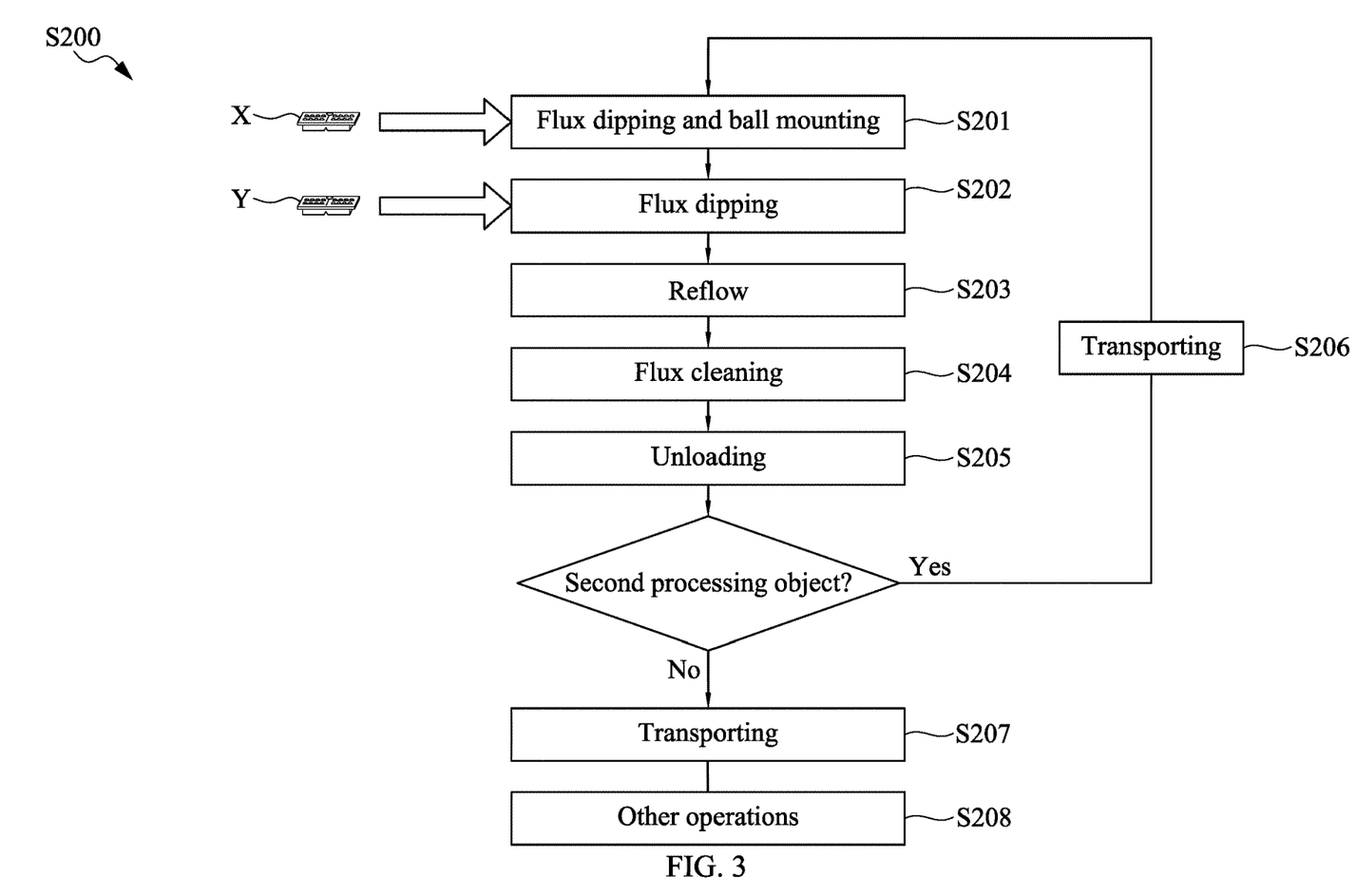
FIG. 3 illustrates a flow chart of manufacturing a semiconductor package structure according to some embodiments of the present disclosure.

FIG. 3 is a flowchart of a method S200 of manufacturing a semiconductor package structure using an apparatus, such as the apparatus T100, according to some embodiments of the present disclosure.

In some embodiments, the method S200 is used to form electrical conductors, such as solder balls, on electrical terminals (e.g., pads) of a package structure. For example, the method S200 may be used to, but is not limited to, remove pollutants from electrical terminals (e.g., pads) and/or form electrical conductors (e.g., solder balls) on the electrical terminals. In some embodiments, the method S200 may include operations S201, S202, S203, S204, and S205. Each of the operations may be applied by one semiconductor manufacturing portion, respectively. Each of the operations may include one or more processes or processes. Further, every semiconductor manufacturing portion may apply one or more processes or processes. It is contemplated that the method S200 may be used in other stages of manufacturing a semiconductor package structure.

In some embodiments, the packaging structure X, with cleaned electrical terminals, are provided and loaded into a semiconductor manufacturing portion (e.g., the semiconductor manufacturing portion T101 as shown in FIG. 2) of a process line (e.g., process line SL as shown in FIG. 2). Then, operation S201 is applied to the packaging structure X. In some embodiments, the operation S201 may include either a flux dipping process (or a dipping process), a ball mounting process, or both.

In some embodiments, the packaging structure Y, with uncleaned electrical terminals, are provided and loaded into a semiconductor manufacturing portion (e.g., the semiconductor manufacturing portion T102 as shown in FIG. 2) of the process line SL. Then, operation S202 is applied to the packaging structure Y. In some embodiments, the operation S202 may include a flux dipping process (or a dipping process). In some embodiments the packaging structure X pass through the semiconductor manufacturing portion T102 without undergoing flux dipping. That is, the packaging structure X bypass the operation S202. In some embodiments, before the operation S201 is applied to the packaging structure X, the packaging structure X and the packaging structure Y may have substantially the same components or structures. For example, before solder balls are formed on the packaging structure X, the only difference between the packaging structure X and the packaging structure Y is whether the pads are cleaned, and they may have substantially the same components or may be identified as the same product. However, the present disclosure is not intended to be limiting. In some embodiments, the operations 201 and 202 may be performed at the same time. In some embodiments, during the operation 201 is performed, the operation 202 begins. In some embodiments, during the operation 202 is performed, the operation 201 begins.

In some embodiments, the operation S203 is applied to either packaging structure X, packaging structure Y, or both after either operation S201, S202, or both are applied. In some embodiments, the operation S203 may include a reflow process. The operation S203 may be performed by, for example, the semiconductor manufacturing portion T103 shown in FIG. 2.

In some embodiments, the operation S204 is applied to either packaging structure X, packaging structure Y, or both after the operation S203 is applied. In some embodiments, the operation S204 may include a flux cleaning process. After the operation S204 is performed, the pollutants on the electronic terminals of the packaging structure Y may be substantially removed, allowing formation of electrical conductors thereon. After operation S204 is performed, the electronic conductors (e.g., solder balls) are attached to the electronic terminals of the packaging structure X. The operation S204 may be performed by, for example, the semiconductor manufacturing portion T104 shown in FIG. 2.

In some embodiments, the operation S205 is applied to either packaging structure X, packaging structure Y, or both, following the operation S204. In some embodiments, operation S205 may include unloading. After operation S205, the packaging structure X and/or the packaging structure Y may be unloaded from the process line SL shown in FIG. 2. In some embodiments, the operation S205 may further include grouping the packaging structure X and the packaging structure Y. The operation S205 may be performed by, for example, the semiconductor manufacturing portion T105 shown in FIG. 2.

In some embodiments, the operation S206 is applied following operation S205. In some embodiments, the operation S206 may include transporting the packaging structure Y into the flux dipping and ball mounting tool (e.g., the semiconductor manufacturing portion T101 shown in FIG. 2) such that the operation S201 may be applied to the packaging structure Y. The operation S206 may be performed by, for example, the transport tool T106 shown in FIG. 2.

In some embodiments, the operation S207 is applied following operation S205. In some embodiments, the operation S207 may include transporting the packaging structure X to another semiconductor manufacturing portion (e.g., the semiconductor manufacturing portion T108 shown in FIG. 2), and other operations S208 may be applied to the packaging structure X.

The operations may continue after loading the packaging structure Y into the semiconductor manufacturing portion T101. Meanwhile, third packaging structure Y, with uncleaned electrical terminals, may be loaded into the semiconductor manufacturing portion T102 such that the operation S201 performed on the packaging structure Y and the operation S202 performed on the third package structures may at least partially overlap with each other.

Figure 4:
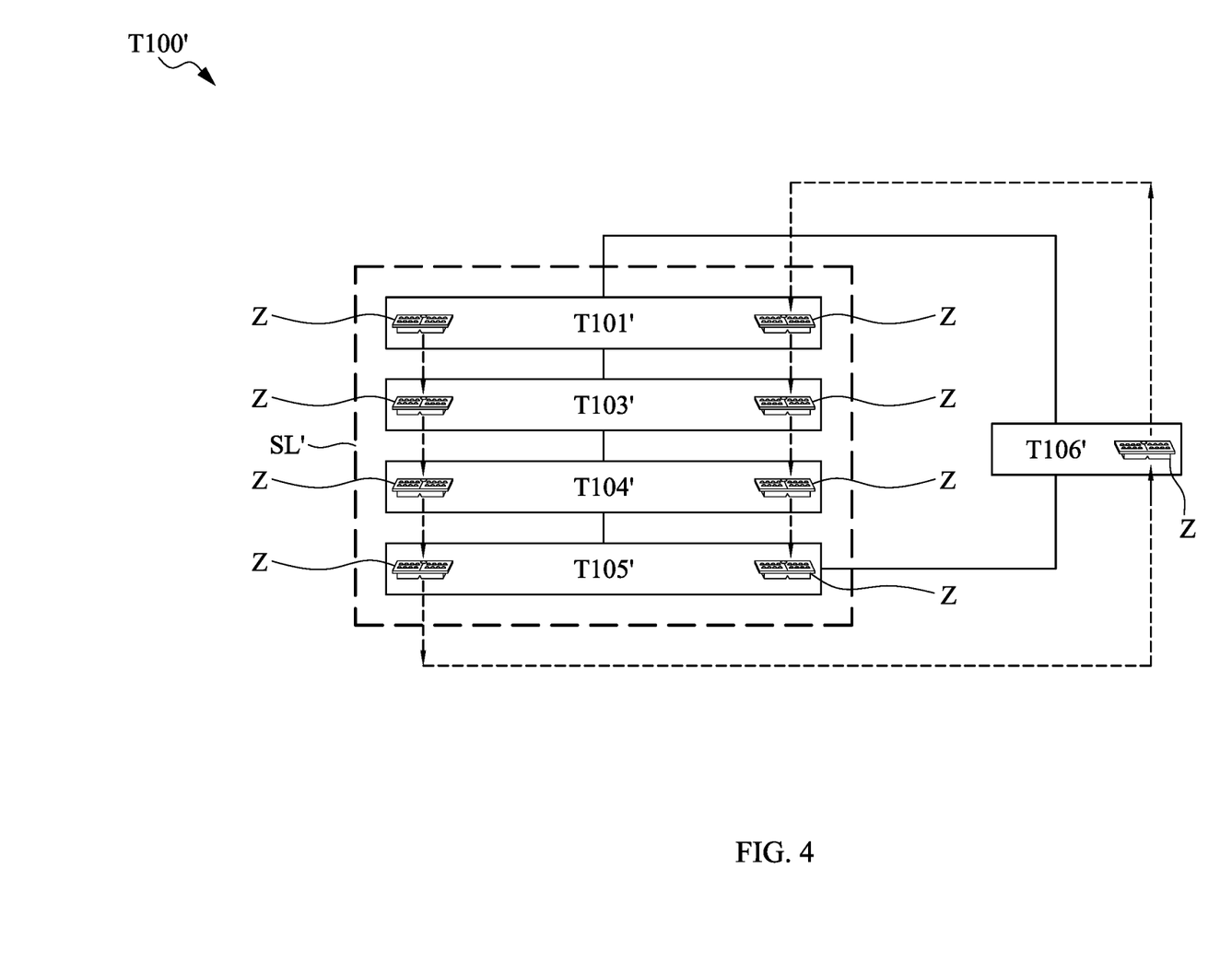
FIG. 4 illustrates an apparatus including a process line of manufacturing a semiconductor package structure according to some embodiments of the present disclosure.

FIG. 4 illustrates an apparatus including a process line T100' of manufacturing a semiconductor package structure according to some embodiments of the present disclosure.

In some embodiments, the apparatus T100' may be used to manufacture a semiconductor package structure. For example, the apparatus T100' may be used to, but is not limited to, remove pollutants from electrical terminals (e.g., pads) and/or form electrical conductors (e.g., solder balls) on the electrical terminals. In some embodiments, the apparatus T100' may include semiconductor manufacturing portions T101', T102', T103', and T104' as well as transport tool T106'. The semiconductor manufacturing portions T101', T103', T104' and T105' may be connected in series to form a process line SL'. The process line SL' may include semiconductor manufacturing portions connected in series. When a packaging structure Z (or a processing object) is loaded into the process line SL', the packaging structure Z may pass through these semiconductor manufacturing portions in sequence. The process line SL' may further include other semiconductor manufacturing portions inserted between any two semiconductor manufacturing portions if needed.

The semiconductor manufacturing portion T101' may include a flux dipping and ball mounting tool. In some embodiments, the flux dipping and ball mounting tool may be configured to apply either a flux dipping process, a ball mounting process, or both to processing objects. The semiconductor manufacturing portion T101' may apply operations corresponding to operations S101 and S104 shown in FIG. 1.

The semiconductor manufacturing portion T103' is in series with the semiconductor manufacturing portion T101'. The semiconductor manufacturing portion T103' may be the same as or similar to the semiconductor manufacturing portion T103, and may apply a reflow operation corresponding to operations S102 and/or S105 as shown in FIG. 1.

The semiconductor manufacturing portion T104' is in series with the semiconductor manufacturing portion T103'. The semiconductor manufacturing portion T104' may be the same as or similar to the semiconductor manufacturing portion T104, and may apply a flux clean operation corresponding to operations S103 and/or S106 as shown in FIG. 1.

The semiconductor manufacturing portion T105' is in series with the semiconductor manufacturing portion T104'. The semiconductor manufacturing portion T105' may be the same as or similar to the semiconductor manufacturing portion T105, and may be configured to unload packaging structure Z (or processing objects) from the process line SL'. In some embodiments, the semiconductor manufacturing portion T105 includes 8 magazines for loading packaging structure Z (or processing objects).

The transport module T106' may be connected to the semiconductor manufacturing portion T105'. The transport module T106' may be configured to transport the packaging structure Z into the semiconductor manufacturing portion T101'. In this embodiment, at the first time the packaging structure Z entering the semiconductor manufacturing portion T101', the semiconductor manufacturing portion T101' performs a flux dipping process on the packaging structure Z; at the second time the packaging structure Z entering the semiconductor manufacturing portion T101', the semiconductor manufacturing portion T101' performs a ball mounting process on the packaging structure Z.

Figure 5:
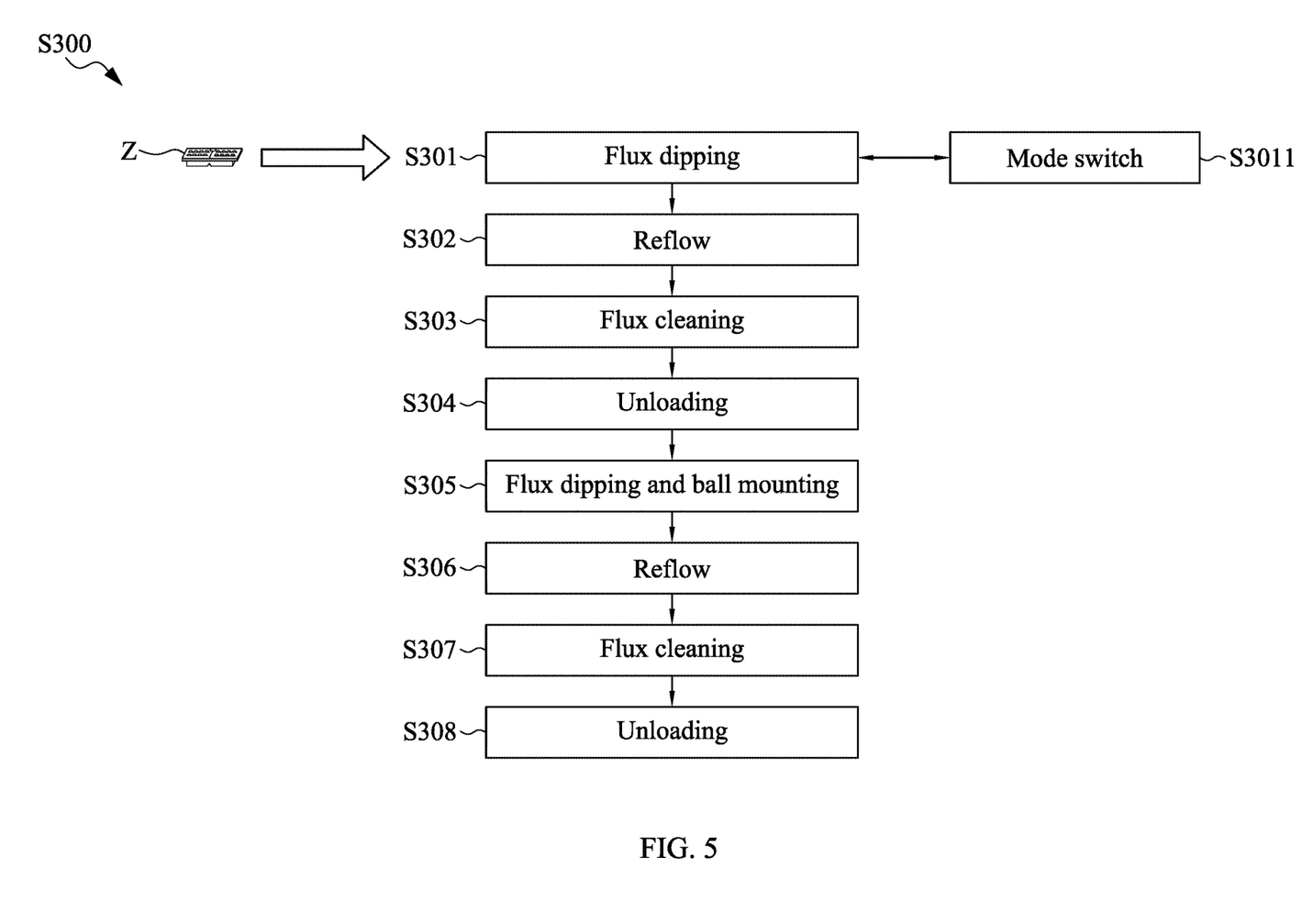
FIG. 5 illustrates a flow chart of manufacturing a semiconductor package structure according to some embodiments of the present disclosure.

FIG. 5 illustrates flow chart of a method S300 of manufacturing a semiconductor package structure by using an apparatus T100' according to some embodiments of the present disclosure.

In some embodiments, the method S300 is used to form electrical conductors, such as solder balls, on electrical terminals (e.g., pads) of a package structure, such as the packaging structure Z. In some embodiments, the method S300 may include operations S301, S302, S303, S304, S305, S306, S307, and S308. Each of the operations may be applied by one semiconductor manufacturing portion, respectively. Each of the operations may include one or more processes or processes. Further, every semiconductor manufacturing portion may apply one or more processes or processes. It is contemplated that the method S300 may be used in other stages of manufacturing a semiconductor package structure.

In some embodiments, packaging structure Z (or processing objects), with uncleaned electrical terminals, are provided and loaded into a semiconductor manufacturing portion (e.g., the semiconductor manufacturing portion T101' as shown in FIG. 4) of a process line (e.g., process line SL' as shown in FIG. 4). Then, operation S301 is applied to the packaging structure Z. In some embodiments, the operation S301 may include a flux dipping process. The operation S301 may be performed by, for example, the semiconductor manufacturing portion T101' shown in FIG. 4.

In some embodiments, the operation S302 is applied to the packaging structure Z after the operation S301 is applied. In some embodiments, the operation S302 may include a reflow process. The operation S302 may be performed by, for example, the semiconductor manufacturing portion T103' shown in FIG. 4.

In some embodiments, the operation S303 is applied to the packaging structure Z after the operation S302 is applied. In some embodiments, the operation S303 may include a flux cleaning process. The operation S303 may be performed by, for example, the semiconductor manufacturing portion T104' shown in FIG. 4. After the operation S303 is performed, the electrical terminals of the packaging structure Z are cleaned.

In some embodiments, the operation S304 is applied to the packaging structure Z after the operation S303 is applied. In some embodiments, the operation S305 may include unloading. After operation S305, the packaging structure Z may be unloaded from the process line SL' shown in FIG. 4. The operation S305 may be performed by, for example, the semiconductor manufacturing portion T105' shown in FIG. 4.

In some embodiments, the packaging structure Z may be transported to the semiconductor manufacturing portion T101' by the semiconductor manufacturing portion T106' shown in FIG. 4.

In some embodiments, the operation S305 is applied to the packaging structure Z, with cleaned electrical terminals, after the operation S304 is applied. In some embodiments, the operation S305 may include a flux dipping process and a ball mounting process. The operation S305 may be performed by, for example, the semiconductor manufacturing portion T101' shown in FIG. 4. In this embodiment, both the operations 301 and S305 are performed by the semiconductor manufacturing portion T101'. Since the process conditions or recipes between the operations S301 and S305 are different, a mode switch operation S3011 should be performed on the semiconductor manufacturing portion T101' such that the both operations S301 and S305 can perform needed processes on the packaging structure Z. The mode switch operation S3011 may cause the semiconductor manufacturing portion T101' to be idle, resulting in reducing the tool efficiency.

In some embodiments, the operation S306 is applied to the packaging structure Z after the operation S305 is applied. In some embodiments, the operation S306 may include a reflow process. The operation S306 may be performed by, for example, the semiconductor manufacturing portion T103' shown in FIG. 4.

In some embodiments, the operation S307 is applied to the packaging structure Z after the operation S306 is applied. In some embodiments, the operation S307 may include a flux cleaning process. The operation S307 may be performed by, for example, the semiconductor manufacturing portion T104' shown in FIG. 4.

In some embodiments, the operation S308 is applied to the packaging structure Z after the operation S307 is applied. In some embodiments, the operation S308 may include unloading. After operation S307, the packaging structure Z may be unloaded from the process line SL' shown in FIG. 4. The operation S308 may be performed by, for example, the semiconductor manufacturing portion T105' shown in FIG. 4.

As shown in FIG. 4 and FIG. 5, when operations S301-S308 are performed on the packaging structure Z, the packaging structure Z will pass through the process line SL' twice. During performing the operations S302-S304, the mode switch operation S3011 is performed on the semiconductor manufacturing portion T101', resulting in idle of the semiconductor manufacturing portions T101', T103', T104' and/or T105'. Further, in this embodiment, each of the T103', T104' and T105' may perform operation on package structures with either cleaned terminals or uncleaned terminals merely.

In the embodiments using the apparatus T100', the process line SL' includes a semiconductor manufacturing portion T101' applying processes on packaging structure Z. In such a condition, the semiconductor manufacturing portion T101' apply both the operations S301 and S305 with different recipes. The mode switch operation S3011 is performed to change the process recipes, resulting in idle of the semiconductor manufacturing portion T101'. In the embodiments using the apparatus T100, an additional flux dipping module (e.g., the semiconductor manufacturing portion T102 shown in FIG. 2) is configured to apply the flux dipping technique on the packaging structure Y, and the packaging structure X may bypass the flux dipping module. In such embodiments, the flux dipping and ball mounting tool can apply flux dipping process (or a dipping process) and the ball mounting process on only the packaging structure X, and it saves the time of switching different process recipes. Therefore, the tool efficiency is improved. Further, in the embodiments of the present disclosure, the apparatus T100 can simultaneously apply the reflow technique and the flux clean technique on both the packaging structure X and the packaging structure Y, and cycle time of manufacturing the semiconductor package structures is also be improved.

Further, in the embodiments of the present disclosure, if either the semiconductor manufacturing portion T101 (or T102) has a breakdown, the packaging structure Y (or the packaging structure X) can still pass through subsequent semiconductor manufacturing processes. Therefore, cycle time of manufacturing is not affected by the breakdown of the semiconductor manufacturing portion.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated from by such an arrangement.

As used herein, the terms "approximately," "substantially," "substantial" and "about" are used to describe and account for small variations. When used in conjunction with an event or circumstance, the terms can refer to instances in which the event or circumstance occurs precisely as well as instances in which the event or circumstance occurs to a close approximation. For example, when used in conjunction with a numerical value, the terms can refer to a range of variation less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, two numerical values can be deemed to be "substantially" the same or equal if a difference between the values is less than or equal to ±10% of an average of the values, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

As used herein, the singular terms "a," "an," and "the" may include plural referents unless the context clearly dictates otherwise.

As used herein, the terms "conductive," "electrically conductive" and "electrical conductivity" refer to an ability to transport an electric current. Electrically conductive materials typically indicate those materials that exhibit little or no opposition to the flow of an electric current. One measure of electrical conductivity is Siemens per meter (S/m). Typically, an electrically conductive material is one having a conductivity greater than approximately $10^4$ S/m, such as at least $10^5$ S/m or at least $10^6$ S/m. The electrical conductivity of a material can sometimes vary with temperature. Unless otherwise specified, the electrical conductivity of a material is measured at room temperature.

Additionally, amounts, ratios, and other numerical values are sometimes presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not be necessarily drawn to scale. There may be distinctions between the artistic renditions in the present disclosure and the actual apparatus due to manufacturing processes and tolerances. There may be other embodiments of the present disclosure which are not specifically illustrated. The specification and drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations of the present disclosure.

What is claimed is:

1. A method for manufacturing a semiconductor package structure, comprising:
   providing a process line comprising a first semiconductor manufacturing portion configured to provide a first operation including a first process step, and a second semiconductor manufacturing portion configured to provide a second operation including a second process step;
   passing a packaging structure through the second semiconductor manufacturing portion, wherein the second semiconductor manufacturing portion applies the second process step to the packaging structure;
   passing the packaging structure through the first semiconductor manufacturing portion, wherein the first semiconductor manufacturing portion applies the first process step to the packaging structure;
   passing the packaging structure through the second semiconductor manufacturing portion again without applying the second process step thereon, wherein the first semiconductor manufacturing portion is configured to receive a first semiconductor package, and the second semiconductor manufacturing portion is configured to receive a second semiconductor package different from the first semiconductor package:
   passing the first semiconductor package through the second semiconductor manufacturing portion without applying the second process step thereto; and
   applying the second process step to the second semiconductor package.

2. The method of claim 1, further comprising:
   unloading the packaging structure from the process line; and then
   transporting the packaging structure into the first semiconductor manufacturing portion of the process line.

3. The method of claim 1, wherein the second operation is configured to spread a pollutant-removing solvent which is configured to react with or dissolve pollutants or metal oxides on an electrical terminal of the packaging structure.

4. The method of claim 3, further comprising a third operation configured to activate the pollutant-removing solvent.

5. The method of claim 3, wherein the first operation is configured to spread a solder-assisting solvent on the electrical terminal of the packaging structure.

6. The method of claim 1, wherein the second operation is not configured to form a solder on a terminal of the packaging structure.

7. The method of claim 6, wherein the first process step is applied to the packaging structure after the second process step is applied, and the first operation further includes forming the solder on the terminal of the packaging structure.

8. The method of claim 1, further comprising:
   performing a first flux cleaning process before applying the first process step to the packaging structure.

9. The method of claim 8, further comprising:
   performing a second flux cleaning process after applying the first process step to the packaging structure.

10. The method of claim 1, wherein the process line further comprises a third semiconductor manufacturing portion and the method further comprises passing the first packaging structure and the second packaging structure to the third semiconductor manufacturing portion.

11. The method of claim 1, further comprising:
    unloading the packaging structure from the process line before applying the first process step to the packaging structure.

12. The method of claim 11, wherein step of unloading the packaging structure from the process line is between applying the first process step to the packing structure and applying the second process step to the packing structure.

* * * * *